(12) United States Patent
Yoshigai

(10) Patent No.: US 10,730,314 B2
(45) Date of Patent: Aug. 4, 2020

(54) PRINTER

(71) Applicant: SEIKO EPSON CORPORATION, Tokyo (JP)

(72) Inventor: Hideaki Yoshigai, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 252 days.

(21) Appl. No.: 15/849,877

(22) Filed: Dec. 21, 2017

(65) Prior Publication Data

US 2018/0178545 A1 Jun. 28, 2018

(30) Foreign Application Priority Data

Dec. 27, 2016 (JP) .................................. 2016-254250

(51) Int. Cl.
*B41J 2/30* (2006.01)
*H03K 17/16* (2006.01)
*B41J 9/48* (2006.01)

(52) U.S. Cl.
CPC . *B41J 2/30* (2013.01); *B41J 9/48* (2013.01); *H03K 17/16* (2013.01)

(58) Field of Classification Search
CPC ................ B41J 9/48; B41J 2/30; H03K 17/16
See application file for complete search history.

(56) References Cited

U.S. PATENT DOCUMENTS

| | | | | |
|---|---|---|---|---|
| 3,947,739 A | * | 3/1976 | Horiuchi | B60L 9/00 318/376 |
| 4,170,411 A | * | 10/1979 | Taguchi | G03B 7/083 396/228 |
| 4,455,587 A | * | 6/1984 | Potthof | H01H 47/226 307/127 |
| 5,749,457 A | * | 5/1998 | Castaneda | H01H 1/5805 200/343 |
| 2003/0147264 A1 | * | 8/2003 | Jinno | H02M 1/34 363/20 |
| 2011/0227419 A1 | * | 9/2011 | Sato | H03H 7/0115 307/104 |
| 2014/0266450 A1 | * | 9/2014 | Talegaonkar | H03F 3/16 330/277 |

(Continued)

FOREIGN PATENT DOCUMENTS

JP 2015-171024 A 9/2015

*Primary Examiner* — David H Banh
(74) *Attorney, Agent, or Firm* — Global IP Counselors, LLP

(57) ABSTRACT

A printer that performs character printing by driving a character printing section, the printer including a character printing section driving element that electromechanically converts drive power, a switch that switches between states of whether or not to supply the drive power, a reverse voltage regeneration circuit that regenerates a reverse voltage generated by electromechanical conversion, and a circuit board on which the reverse voltage regeneration circuit and the switch are mounted, wherein the reverse voltage regeneration circuit has a first reverse voltage regeneration circuit and a second reverse voltage regeneration circuit, the first reverse voltage regeneration circuit has a first smoothing coil, and the second reverse voltage regeneration circuit has a second smoothing coil, and the switch is mounted on a board surface of the circuit board so as to be disposed between the first smoothing coil and the second smoothing coil.

7 Claims, 8 Drawing Sheets

(56) References Cited

U.S. PATENT DOCUMENTS

| | | | | |
|---|---|---|---|---|
| 2015/0069832 A1* | 3/2015 | Yamane | ................ | B60L 3/003 |
| | | | | 307/10.1 |
| 2015/0180455 A1* | 6/2015 | Beccue | ................ | H03B 5/18 |
| | | | | 331/57 |
| 2015/0372664 A1* | 12/2015 | Walker | ................ | H03K 3/012 |
| | | | | 331/49 |

* cited by examiner

PRINTER

This application claims priority to Japanese Patent Application No. 2016-254250 filed on Dec. 27, 2016. The entire disclosure of Japanese Patent Application No. 2016-254250 is hereby incorporated herein by reference.

BACKGROUND

1. Technical Field

The present invention relates to a printer that performs character printing by driving a character printing section.

2. Related Art

A printer (for example, a dot impact printer) that is provided with a driving element that electromechanically converts a voltage and drives a character printing section, drives the character printing section by supplying power (a voltage) for driving to the driving element, and prints characters, or the like, on a printing medium is known. In the related art, this kind of printer is provided with a reverse voltage regeneration circuit that regenerates a reverse voltage generated by electromechanical conversion in the driving element after supply, to the driving element, of the drive power is interrupted (for example, refer to JP-A-2015-171024).

However, in the printer of the related art, a configuration that respectively regenerates reverse voltages in a plurality of driving elements by using a single reverse voltage regeneration circuit, is used. Therefore, for example, in a case in which the character printing section is driven by multiple driving elements in a printer such as a when performing high definition printing, there is a high probability that a large number of reverse voltage will be generated simultaneously, and therefore, there are cases in which the large number of reverse voltages are supplied to the single reverse voltage regeneration circuit.

In a case in which a large number of reverse voltages are supplied to the reverse voltage regeneration circuit in this manner, for example, a voltage value of the reverse voltages rises due to the voltages being superimposed, and therefore, there is a high probability that a large current, that is, a large charge, will flow into the reverse voltage regeneration circuit. Therefore, it is necessary to increase the voltage endurance, increase the electrostatic capacitance, and the like, in electrical elements that configure the reverse voltage regeneration circuit.

As a result of this, since the size of the external form of the electrical elements that configure the reverse voltage regeneration circuit is increased and the size of a circuit board on which the reverse voltage regeneration circuit is mounted is also increased, there is a problem in that it is difficult to decrease the size of the printer. In addition, in a case in which regeneration of the voltages is performed in a single reverse voltage regeneration circuit, since fluctuations occur in the operating voltage of the reverse voltage regeneration circuit itself due to the large number of reverse voltages supplied, there is a problem in that variations in the voltage that is regenerated increase in size.

Additionally, even in a case in which there is a small number (for example, one) of driving elements that drive the character printing section, in a case in which the charge of the reverse voltage to be generated is large (the current is large), since it is necessary to increase the voltage endurance, increase the electrostatic capacitance, and the like, in electrical elements that configure the reverse voltage regeneration circuit, it is possible for a problem in which it is difficult to decrease the size of the printer to occur.

SUMMARY

An advantage of some aspects of the invention is to provide a printer provided with a reverse voltage regeneration circuit in which an increase in size is suppressed and variations in a voltage that is regenerated are suppressed.

Hereinafter, means for solving the above-mentioned problems and operational effects thereof will be described.

According to an aspect of the invention, in order to solve the above-mentioned problems, there is provided a printer that performs character printing by driving a character printing section, the printer including a character printing section driving element that electromechanically converts drive power and drives the character printing section, a switch that switches between states of whether or not to supply the drive power to the character printing section driving element, a reverse voltage regeneration circuit that regenerates a reverse voltage generated by electromechanical conversion in the character printing section driving element after supply, to the character printing section driving element, of the drive power is interrupted, and a circuit board on which the reverse voltage regeneration circuit and the switch are mounted, in which the reverse voltage regeneration circuit has a first reverse voltage regeneration circuit and a second reverse voltage regeneration circuit, the first reverse voltage regeneration circuit has a first smoothing coil that smoothes the reverse voltage of the character printing section driving element, and the second reverse voltage regeneration circuit has a second smoothing coil that smoothes the reverse voltage of the character printing section driving element, and the switch is mounted on a board surface of the circuit board so as to be disposed between the first smoothing coil and the second smoothing coil.

According to this configuration, an increase in the size of the electrical elements that configure the reverse voltage regeneration circuits is suppressed as a result of the two (plurality of) reverse voltage regeneration circuits, and interference (magnetic interference) between the two smoothing coils is suppressed as a result of the two smoothing coils being disposed with the switch interposed therebetween, and therefore, variations in the regenerated voltage are suppressed.

In the printer, it is preferable that the switch form a shape that has a plurality of outer surfaces, and be mounted on the circuit board in a posture in which, a main surface, which has the broadest surface area among the plurality of outer surfaces, intersects the board surface of the circuit board.

According to this configuration, it is possible to effectively suppress interference (magnetic interference) between the smoothing coils on the board surface of the circuit board by using the switch, which is disposed so that the main surface acts as a wall of the two smoothing coils.

In the printer, it is preferable that, in the switch, a metal plate, which has higher magnetic permeability than atmospheric air, be attached to the main surface.

According to this configuration, since magnetic fluxes that the smoothing coils generate flow through the metal plate, which has high magnetic permeability, it is possible to suppress interference (magnetic interference) between the two smoothing coils.

In the printer, it is preferable that the circuit board constitute a rectangular form having two sets of edge pairs that face one another, and the first smoothing coil and the second smoothing coil be respectively mounted on the circuit board in one set among the two sets of edge pairs with the first smoothing coil disposed on one edge side and the second smoothing coil disposed on other edge side.

According to this configuration, since the two smoothing coils are disposed on the circuit board in positions that are separated from one another, it is possible to suppress interference (magnetic interference) between the coils.

In the printer, it is preferable that an input terminal, to which a character printing control signal for generating a switching signal for switching the switch is input, and the first smoothing coil and the second smoothing coil be respectively mounted on the circuit board with the input terminal disposed on one edge side and the first smoothing coil and the second smoothing coil disposed on other edge side, in other set of an edge pair, which is different from the one set to which the edges at which the first smoothing coil and the second smoothing coil are disposed belong.

According to this configuration, since the two smoothing coils are disposed on the circuit board in positions that are separated from the input terminal to which the character printing control signal is input, it is possible to suppress interference (magnetic interference) of the smoothing coils with the character printing control signal.

In the printer, it is preferable that a control element, which generates the switching signal using the character printing control signal input from the input terminal and supplies the switching signal to the switch, be mounted on the circuit board, and on the board surface of the circuit board, a distance that follows the board surface from the control element up to the first smoothing coil and a distance that follows the board surface from the control element up to the second smoothing coil both be longer than a distance that follows the board surface from the control element up to the switch.

According to this configuration, it is possible to prevent interference (magnetic interference) of the smoothing coils with the switching signal that flows through the switch from the control element.

It is preferable that the printer further include a first driving element group and a second driving element group, which each include half or less of a number of character printing section driving elements that drive the character printing section during character printing, the first reverse voltage regeneration circuit regenerate reverse voltages generated by character printing section driving elements included in the first driving element group, and the second reverse voltage regeneration circuit regenerate reverse voltages generated by character printing section driving elements included in the second driving element group.

According to this configuration, in a printer provided with multiple character printing section driving elements, since the number of reverse voltages of character printing section driving elements supplied to a single reverse voltage regeneration circuit is suppressed, it is possible to suppress an increase in size of the reverse voltage regeneration circuits.

BRIEF DESCRIPTION OF THE DRAWINGS

The invention will be described with reference to the accompanying drawings, wherein like numbers reference like elements.

FIG. 2 is a schematic view that describes a drive operation of a character printing section that the printer is provided with.

DESCRIPTION OF EXEMPLARY EMBODIMENTS

Hereinafter, an embodiment of a printer will be described with reference to the drawings.

Figure 1:
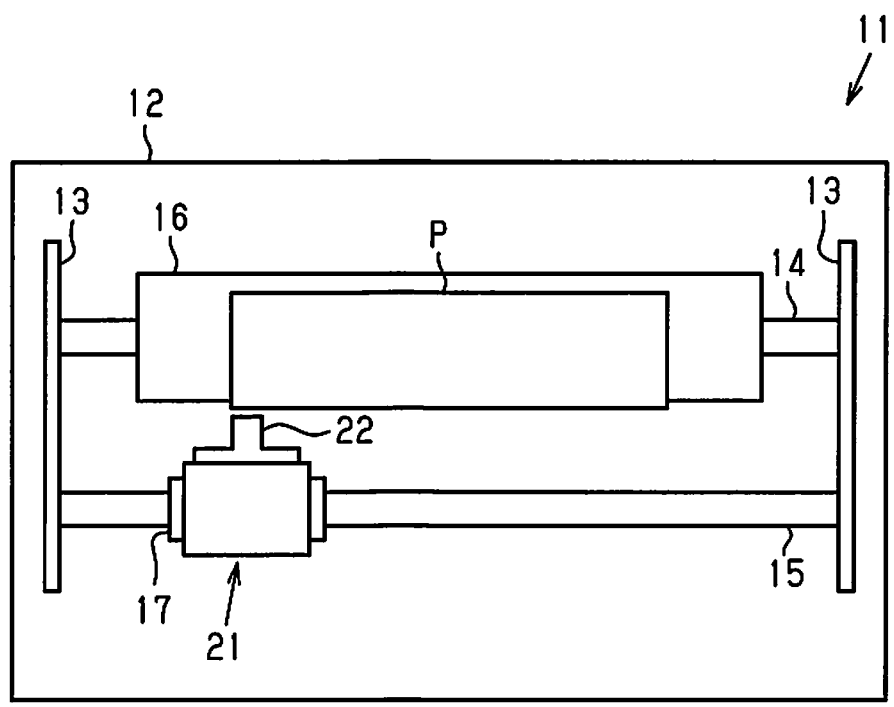
FIG. 1 is a schematic view that shows a schematic configuration of a printer of an embodiment.

As shown in FIG. 1, a printer 11 is provided with a rectangular housing 12, in which the left-right direction in FIG. 1 is defined as a longitudinal direction. In the housing 12, frame members 13, which face one another, are respectively disposed at both ends in the longitudinal direction. A rotary shaft 14 and a guide shaft 15 are installed on the two frame members 13 in a parallel manner to one another so as to follow the longitudinal direction. The rotary shaft 14 is provided in a rotatable manner relative to the frame members 13, and a cylindrical roller 16, which is long in the longitudinal direction, is attached to the outer peripheral surface thereof. The roller 16 is configured to be capable of rotating together with the rotary shaft 14, and, transports a medium P such as a sheet of paper by rotating, for example. That is, the medium P is wound around the roller 16, and is transported in a direction that intersects the longitudinal direction of the housing 12.

A carriage 17, which is capable of moving along the guide shaft 15, is attached to the guide shaft 15. A head 21 that performs printing on the medium P is mounted in the carriage 17. The head 21 is positioned so as to face the roller 16. In addition, the head 21 is provided with a nose section 22 that protrudes toward the roller 16. Further, the head 21 causes a head pin 207 (refer to FIG. 2), which configures a character printing section 20, to project from a tip end of the nose section 22, which faces the roller 16, and reproduces dots on the medium P and character prints characters, symbols, and the like, as a result of the head pin 207 applying a pressure to the medium P via an ink ribbon, or the like.

That is, the printer 11 is a dot impact type printer that performs printing on the medium P as a result of the head pin 207 beating the ink ribbon into the medium P. Further, as a result of movement of the carriage 17, the head 21 performs printing while moving in a main scanning direction relative to the medium P, which is supported by the roller 16. In the present embodiment, the main scanning direction, which is a movement direction of the head 21 that moves due to the carriage 17, coincides with the longitudinal direction of the housing 12. In addition, a direction in which the medium P is transported by the roller 16 is defined as a sub-scanning direction, which intersects the main scanning direction.

Additionally, the printer 11 of the present embodiment is configured to be capable of performing printing without using an ink ribbon and using the medium P only due to a pressure-sensitive paper such as carbonless paper, for example, being adopted as the medium P. Naturally, in a case in which a pressure-sensitive paper such as carbonless paper is adopted, a configuration in which a separate ink ribbon is provided between the roller 16 and the nose section 22 may also be used.

Figure 2:
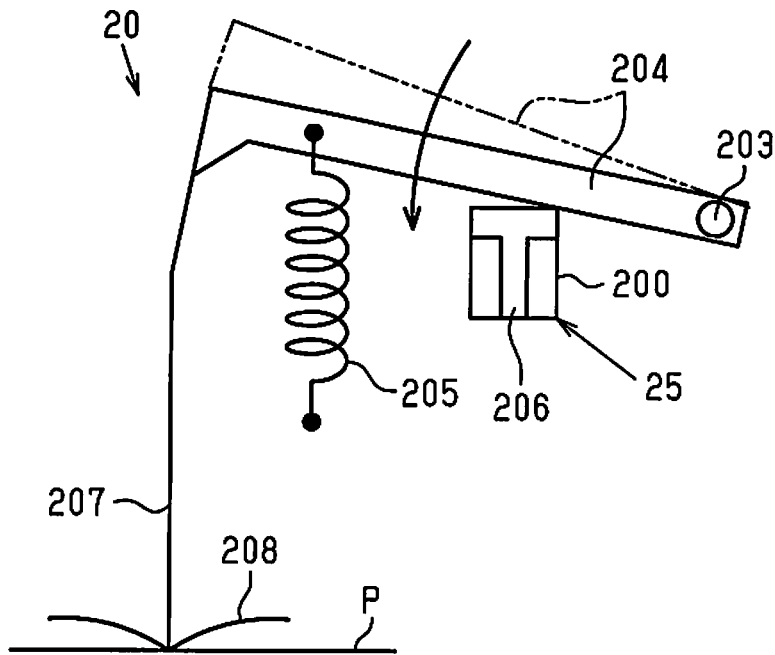
Figure 3:
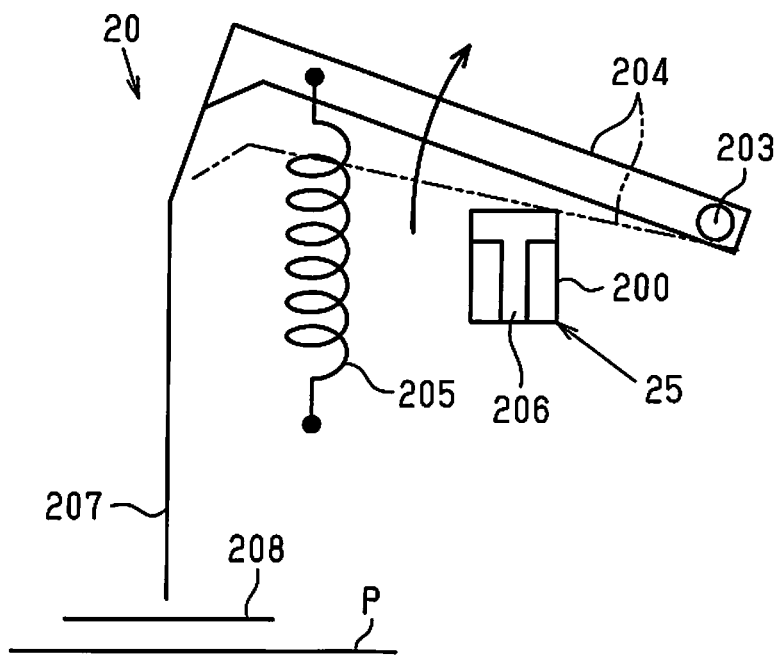
FIG. 3 is a schematic view that describes an operation in which a reverse voltage is generated in a character printing section driving element.

As shown in FIGS. 2 and 3, the character printing section 20 is configured to include a metallic lever 204 that is capable of rotating with a shaft 203 as the center thereof, a wire form head pin 207 that is connected to the metallic lever 204, and a return spring 205. In addition, a drive coil 25 that functions as an electromagnet in which a coil 200 is wound around an iron core 206, and a magnetic force is generated in the iron core 206 as a result of a current that flows through the coil 200, is also provided.

In the drive coil 25, a current flows through the coil 200 when a voltage is applied to the coil 200 by a character printing control signal that controls character printing, and as shown by the dashed-two dotted line and the solid line in FIG. 2, the metallic lever 204 of the character printing section 20 rotates with the shaft 203 as the center thereof and is attracted to the iron core 206 due to the magnetic force of the electromagnet that is generated by the current that is flowing. Further, an image of dots is formed on the medium P, such as paper, as a result of the head pin 207, which is connected to the lever 204, striking an ink ribbon 208 against the medium P. Accordingly, the drive coil 25 functions as a character printing section driving element that electromechanically converts the drive power supplied by the voltage that is applied and the current that flows, and drives (causes to rotate) the character printing section 20 (the lever 204).

In addition, the return spring 205 pushes the lever 204, and biases the lever 204 in a direction of separating from the iron core 206. Accordingly, when the current that flows through the coil 200 due to the character printing control signal, which controls character printing, is interrupted, the magnetic force generated in the coil 200 ceases. Therefore, as shown by the dashed-two dotted line and the solid line in FIG. 3, the lever 204 rotates with the shaft 203 as the center thereof and returns to the original position prior to being attracted due to the biasing force of the return spring 205. As a result of this, the head pin 207 is separated from the ink ribbon 208 and also returns to the original position thereof.

In the present embodiment, in a process in which the lever 204 returns to the original position thereof, the magnetic fluxes (the number of lines of magnetic force) generated in the iron core 206 changes (decreases). Further, in conjunction with the change in magnetic fluxes, a current flows through the coil 200 that is wound around the iron core 206 due to electromagnetic induction, and a voltage, that is, a reverse voltage is generated.

Next, a configuration of a drive circuit of the character printing section 20 will be described.

Figure 4:
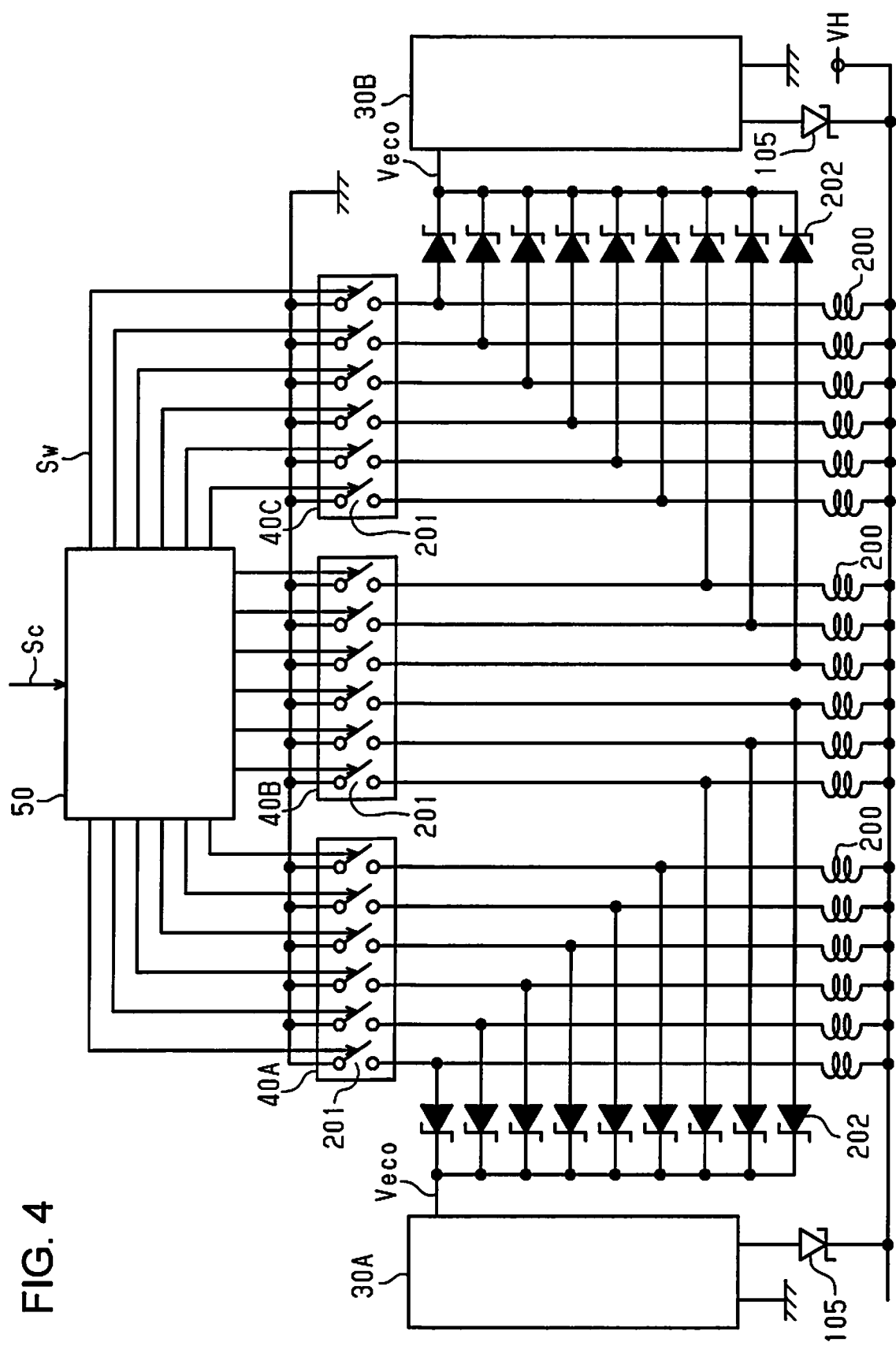
FIG. 4 is a block diagram that shows a configuration of a drive circuit of the character printing section.

As shown in FIG. 4, a drive circuit of the character printing section 20 of the present embodiment has a control element 50, three switching elements 40A, 40B, and 40C, and two reverse voltage regeneration circuits, namely, a first reverse voltage regeneration circuit 30A and a second reverse voltage regeneration circuit 30B.

The control element 50 is an element that has an integrated circuit, and for example, a character printing control signal Sc, which controls character printing, is input from a host computer, and a switching signals Sw, which switch between on and off states of switches 201 respectively provided in the each of the switching elements 40A, 40B, and 40C, are generated using the input character printing control signal Sc.

For example, in each of the switching elements 40A, 40B, and 40C, electrical switches 201 are provided using transistors, or the like, a power source VH is connected to the coil 200 of the drive coil 25, which drives the character printing section 20, as a result of the switches 201 turning from off to on, and drive power is supplied from the power source VH. Accordingly, each of the switching elements 40A, 40B, and 40C functions as a switch that switches between states of whether or not to supply drive power to the drive coil 25 (the character printing section driving element).

In the present embodiment, six switches 201 are respectively provided in each of the switching elements 40A, 40B, and 40C, and respectively switch between states of whether or not to supply drive power to a total of 18 coils 200. That is, in the printer 11 of the present embodiment, in the coils 200, in which one end is connected to the power source VH and the other end of which is connected to a switch 201, a current flows as a result of the switches 201 being turned on in accordance with the switching signals Sw, and character printing is performed as a result of the 18 head pins 207 striking the ink ribbon 208 against the medium P. In other words, 18 corresponds to the number of drive coils 25 (character printing section driving elements) that drive the head pins 207 (character printing sections 20) during character printing.

In the present embodiment, the first reverse voltage regeneration circuit 30A and the second reverse voltage regeneration circuit 30B have the same circuit configuration, and constitute regeneration circuits that recover reverse voltages generated in the coils 200 of the drive coils 25 and return the reverse voltages to the power source VH as power.

That is, as shown in FIG. 4, the sides of the coils 200 that are connected to the switches 201 are connected to the first reverse voltage regeneration circuit 30A and the second reverse voltage regeneration circuit 30B via diodes 202, and reverse voltages (currents) generated in the coils 200 are supplied by the diodes 202 without flowing in reverse. Additionally, reverse voltages that are supplied (applied) to the first reverse voltage regeneration circuit 30A and the second reverse voltage regeneration circuit 30B via the diodes 202 will be referred to as voltages Veco.

In the present embodiment, in order for the reverse voltages generated in the 18 coils 200 to be equally divided (two equal parts) and supplied, nine coils 200, which is half of the 18 coils 200 (drive coils 25), are respectively connected to the first reverse voltage regeneration circuit 30A and the second reverse voltage regeneration circuit 30B.

That is, the six coils 200 that are connected to the power source VH by the six switches 201 of the switching element 40A and three coils 200 among the six coils 200 that are connected to the power source VH by the six of the switches 201 of the switching element 40B are connected to the first reverse voltage regeneration circuit 30A as a first driving element group. Meanwhile, the six coils 200 that are connected to the power source VH by the six switches 201 of the switching element 40C and three coils 200 among the six coils 200 that are connected to the power source VH by the six of the switches 201 of the switching element 40B are connected to the second reverse voltage regeneration circuit 30B as a second driving element group. In other words, the first driving element group and the second driving element group, which are each composed of nine coils 200, corresponding to half of the 18 that drive the character printing sections 20 during character printing, are provided in the printer 11.

Further, the first reverse voltage regeneration circuit 30A regenerates reverse voltages (voltage Veco) that the coils 200 included in the first driving element group create, and the second reverse voltage regeneration circuit 30B regenerates reverse voltages (voltage Veco) that the coils 200 included in the second driving element group create. That is, the first reverse voltage regeneration circuit 30A and the second reverse voltage regeneration circuit 30B are respectively connected to the power source VH via diodes 105, and in each of the first reverse voltage regeneration circuit 30A and the second reverse voltage regeneration circuit 30B, reverse voltages (voltages Veco) become currents (power) and are returned to the power source VH via the diodes 105.

Next, the circuit configurations of the first reverse voltage regeneration circuit 30A and the second reverse voltage regeneration circuit 30B will be described. Additionally, in the present embodiment, the first reverse voltage regeneration circuit 30A and the second reverse voltage regeneration circuit 30B have the same circuit configuration, and therefore, in this instance, description will be given using the first reverse voltage regeneration circuit 30A as a representative.

Figure 5:
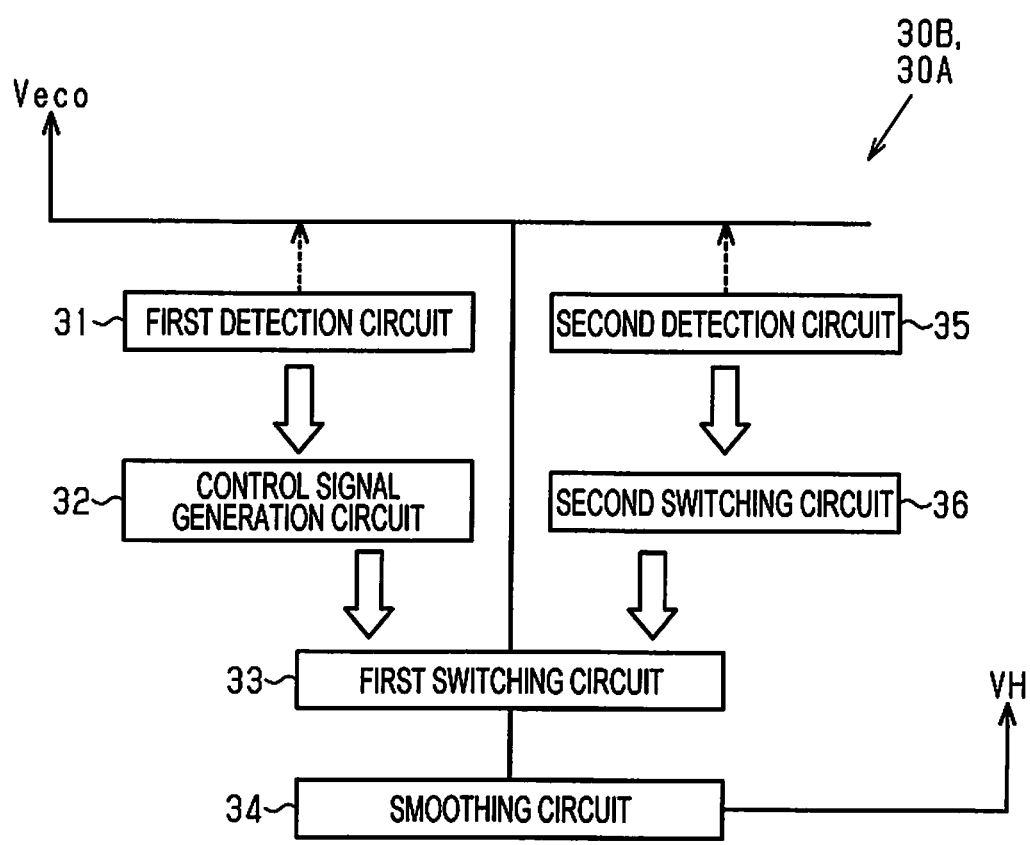
FIG. 5 is a block diagram that shows a configuration of a reverse voltage regeneration circuit.
Figure 6:
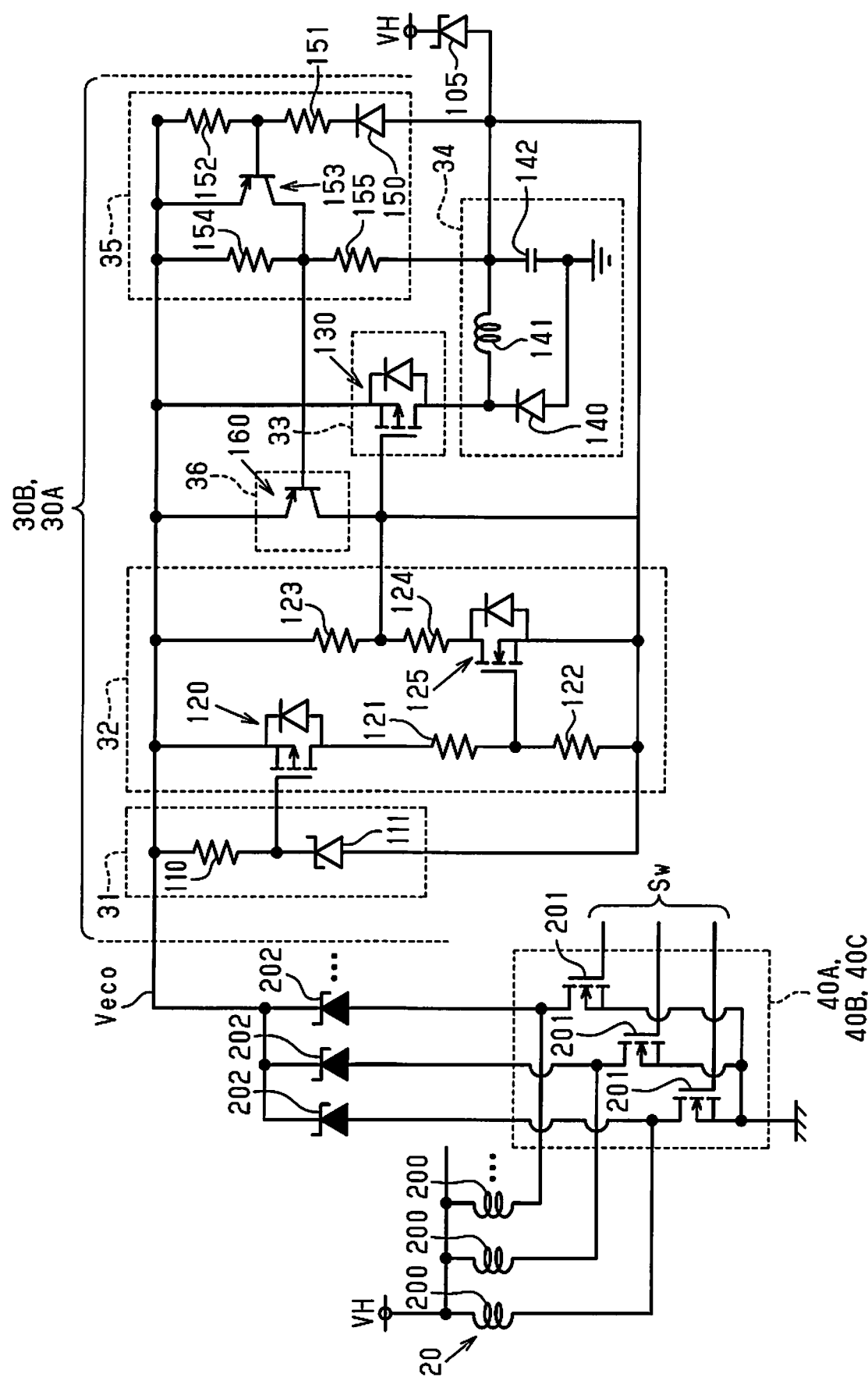
FIG. 6 is a circuit diagram that shows a specific circuit configuration of the reverse voltage regeneration circuit.

As shown in FIGS. 5 and 6, the first reverse voltage regeneration circuit 30A is provided with a first detection circuit 31, a control signal generation circuit 32, a first switching circuit 33, a smoothing circuit 34, a second detection circuit 35, and a second switching circuit 36. Each circuit is respectively configured by an electrical element such as a transistor or a resistance, and is mounted on a circuit board 60 (refer to FIG. 7).

The first detection circuit 31 and the second detection circuit 35 are voltage detection circuits that detect value of a voltage Veco. The first detection circuit 31 outputs a signal (a voltage) to the control signal generation circuit 32 in accordance with the size of the voltage Veco. The control signal generation circuit 32 outputs an on signal or an off signal to the first switching circuit 33 on the basis of the signal output from the first detection circuit 31. The first switching circuit 33 electrically connects the smoothing circuit 34 to the voltage Veco (a coil 200) in a case in which the on signal is output from the control signal generation circuit 32, and interrupts electrical connection of the voltage Veco (a coil 200) and the smoothing circuit 34 in a case in which the off signal is input from the control signal generation circuit 32.

The second detection circuit 35 outputs a signal (a voltage) to the second switching circuit 36 in accordance with the size of the voltage Veco. The second switching circuit 36 operates the first switching circuit 33 and interrupts electrical connection of the voltage Veco (a coil 200) and the smoothing circuit 34 on the basis of the signal output from the second detection circuit 35.

In the smoothing circuit 34, an output terminal is connected to the power source VH via the diode 105, and a current generated by the voltage Veco supplied from the coil 200 through the first switching circuit 33 is smoothed and returned to the power source VH.

Next, a specific configuration of each circuit will be described with reference to FIG. 6.

The first detection circuit 31 includes a resistance 110 and a Zener diode 111. The Zener diode 111 allows a current to flow through the resistance 110 in a case in which the voltage Veco, which is supplied via the diodes 202 and is based on the reverse voltage generated in the coils 200, is in a large voltage state that exceeds a Zener voltage of the Zener diode 111. As a result of this, a voltage reduction from the voltage Veco that depends on the current that is flowing, occurs in the resistance 110. The first detection circuit 31 outputs a voltage that is reduced from the voltage Veco by the resistance 110 to the control signal generation circuit 32 as a signal.

The control signal generation circuit 32 includes a p-channel type FET 120, a resistance 121, a resistance 122, a resistance 123, a resistance 124, and an n-channel type FET 125. Further, as a result of the voltage reduction due to the resistance 110, which is a signal output from the first detection circuit 31, at a point in time at which the gate voltage applied to the gate of the FET 120 exceeds a predetermined threshold voltage value, the FET 120 is turned on, a current flows through the resistance 121 and the resistance 122, and a voltage reduction occurs in the resistance 122. When the voltage reduction of the resistance 122 exceeds a predetermined value, the FET 125 is turned on, a current flows through the resistance 123 and the resistance 124, and a voltage reduction occurs in the resistance 123.

Meanwhile, when a reduction from the voltage Veco being in a large voltage state is started and the voltage reduction of the resistance 110 in the first detection circuit 31 is less than the threshold voltage value of the FET 120, the FET 120 is turned off, and the current of the resistance 121 and the resistance 122 is interrupted. As a result of this, the voltage reduction in the resistance 122 does not occur, and the FET 125 is turned off. Further, the current of the resistance 123 and the resistance 124 is interrupted, and the voltage reduction of the resistance 123 decreases to zero.

The first switching circuit 33 includes a p-channel type FET 130. Further, when the voltage Veco is in a high voltage state, the FET 125 is turned on, and the voltage reduction that occurs in the resistance 123 reaches a predetermined threshold value or more that turns the FET 130 on, the FET 130 receives a voltage showing the voltage reduction of the resistance 123 as an on signal, turns on, and electrically connects the coils 200 and the smoothing circuit 34. Meanwhile, when the voltage Veco falls from a high voltage state, the FET 125 is turned off and the current of the resistance 123 is interrupted, the voltage reduction of the resistance 123 is reduced. Further, in a case in which the voltage reduction of the resistance 123 falls below the predetermined threshold value that turns the FET 130 on, the FET 130 receives a voltage showing the voltage reduction as an off signal, turns off, and interrupts the electrical connection of the coils 200 and the smoothing circuit 34.

The second detection circuit 35 includes a Zener diode 150, a resistance 151, a resistance 152, a pnp type transistor 153, a resistance 154, and a resistance 155. In addition, the second switching circuit 36 has a pnp type transistor 160. Further, the second detection circuit 35 outputs a base voltage of the transistor 160 to the second switching circuit 36 as a signal.

That is, in the second detection circuit 35, in a state in which the voltage Veco is a predetermined voltage or less, since a current is not flowing through the resistance 151 and the resistance 152 due to the Zener diode 150, the transistor 153 turns off since a current is not flowing between a base emitter. Therefore, the voltage between the base emitter of the transistor 160 exceeds a threshold value due to the voltage reduction of the resistance 154, and the transistor 160 turns on.

Meanwhile, when the voltage Veco is large and exceeds a predetermined voltage, since the Zener diode 150 allows a current to flow through the resistance 151 and the resistance 152, a voltage reduction occurs in the resistance 152, and as a result of this, the transistor 153 turns on due to a current flowing between the base emitter. When the transistor 153 is turned on, the transistor 160 is turned off since the voltage between the base emitter of the transistor 160 decreases.

Accordingly, while the voltage Veco has a voltage value that exceeds a predetermined voltage, the transistor 160 is in an off state, and when the voltage Veco rises further in this state, the control signal generation circuit 32 turns the FET 130 on due to the signal that the first detection circuit 31 outputs in the above-mentioned manner, and the voltage Veco is connected to the smoothing circuit 34. As a result of this, a current based on the reverse voltages generated in the coils 200 flows through the smoothing circuit 34, and is regenerated as power to the power source VH.

Meanwhile, when the voltage Veco decreases and becomes a predetermined voltage or less, the transistor 153 is turned off, the transistor 160 turns on, a source terminal and a gate terminal of the FET 130 are electrically connected, and a charge accumulated in a parasitic capacitance between the gate and the source of the FET 130 is discharged. As a result of this, the FET 130 is turned off, and a current that flows through the smoothing circuit 34 via the diodes 202 is interrupted.

In the manner disclosed above, in the present embodiment, as a result of the reverse voltage regeneration circuits having the circuit configuration shown in FIGS. 5 and 6, the first switching circuit 33 turns on when the voltage Veco, which are the reverse voltages of the coils 200, become large voltages that exceed a predetermined voltage, and the first switching circuit 33 is turned off by the action of the second switching circuit 36 when the voltage Veco becomes a predetermined voltage or less. Therefore, the action that turns the first switching circuit 33 on and the action that turns the first switching circuit 33 off are controlled on the basis of respective voltage values of the voltage Veco. That is, in the present embodiment, the voltage Veco, which has a voltage value of an extent that is equal to the voltage value of the power source VH or more, and in which voltage variations are suppressed by turning on and off of the first switching circuit 33 is applied to the smoothing circuit 34.

The smoothing circuit 34 to which the voltage Veco is applied has a diode 140, a coil 141, and a capacitor 142. The anode of the diode 140 is earthed, and the cathode thereof is connected to the drain terminal of the FET 130 and one end of the coil 141. The other end of the coil 141 is connected to one end of the capacitor 142, and the other end of the capacitor 142 is earthed. In addition, the other end of the coil 141 and the one end of the capacitor 142 are connected to the power source VH.

The smoothing circuit 34 receives, at the cathode terminal of the diode 140, a current generated by the voltage Veco that is supplied from the coils 200 through the FET 130. Further, the smoothing circuit 34 smoothes the current received at the cathode terminal of the diode 140, and outputs from a node between the coil 141 and the capacitor 142. In this manner, a current smoothed by the smoothing circuit 34 is returned to the power source VH via the diode 105. Accordingly, electrical elements that configure the smoothing circuit 34 use elements that have voltage endurance and electrostatic capacitance that is compatible with the current generated by the voltage Veco.

Figure 7:
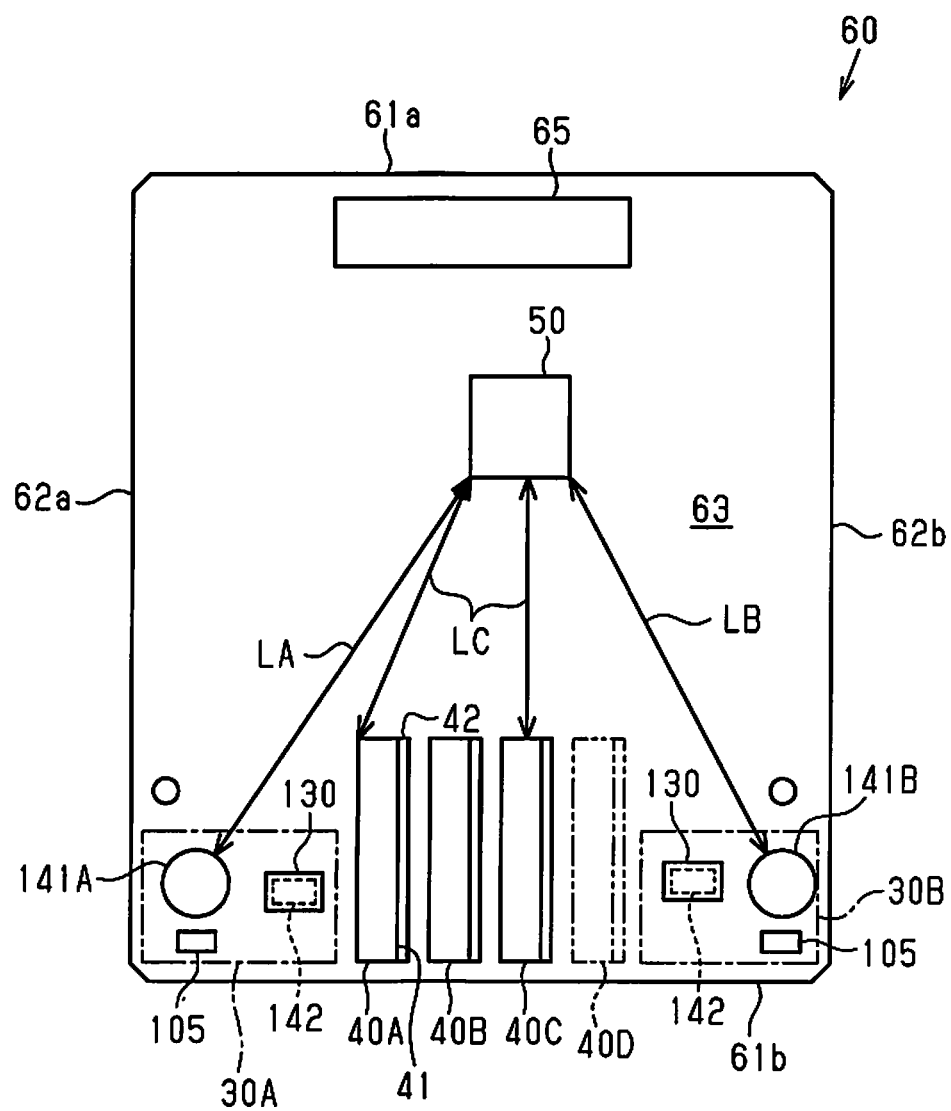
FIG. 7 is a plan view of a circuit board on which the drive circuit of the character printing section is mounted.

Meanwhile, as shown in FIG. 7, in the present embodiment, the drive circuits of the character printing sections 20, which are shown in FIG. 4, are mounted on a single circuit board 60. That is, the first reverse voltage regeneration circuit 30A and the second reverse voltage regeneration circuit 30B are mounted on the circuit board 60. Moreover, in addition to the first reverse voltage regeneration circuit 30A and the second reverse voltage regeneration circuit 30B, the three switching elements 40A, 40B, and 40C, an input terminal 65 such as a connector to which the character printing control signal Sc is input, and the control element 50, which generates the switching signals Sw using the character printing control signal Sc input from the input terminal 65, are mounted on the circuit board 60.

In the present embodiment, the circuit board 60 constitutes a rectangular form having two sets of edge pairs that face one another. That is, the circuit board 60 has two sets of edge pairs, namely, one set of one edge 61a and the other edge 61b that face one another, and one set of one edge 62a and the other edge 62b that face one another. Additionally, the edge 61a (edge 61b) has a shorter dimension than the edge 62a (edge 62b).

Further, in the present embodiment, a first smoothing coil 141A, which corresponds to the coil 141 that configures the smoothing circuit 34 of the first reverse voltage regeneration circuit 30A, is mounted in the set of the edge 62a and the edge 62b among the two sets of edge pairs disposed on the edge 62a side. Meanwhile, a second smoothing coil 141B, which corresponds to the coil 141 that configures the smoothing circuit 34 of the second reverse voltage regeneration circuit 30B, is mounted disposed on the edge 62b side. Additionally, in the present embodiment, axial type coils are adopted, and the first smoothing coil 141A and the second smoothing coil 141B are capable of allowing a large current to flow.

Furthermore, in the present embodiment, the three switching elements 40A, 40B, and 40C are mounted on a board surface 63 of the circuit board 60 disposed between the first smoothing coil 141A and the second smoothing coil 141B, which are respectively mounted on a pair of edge sides that face one another.

Figure 8:
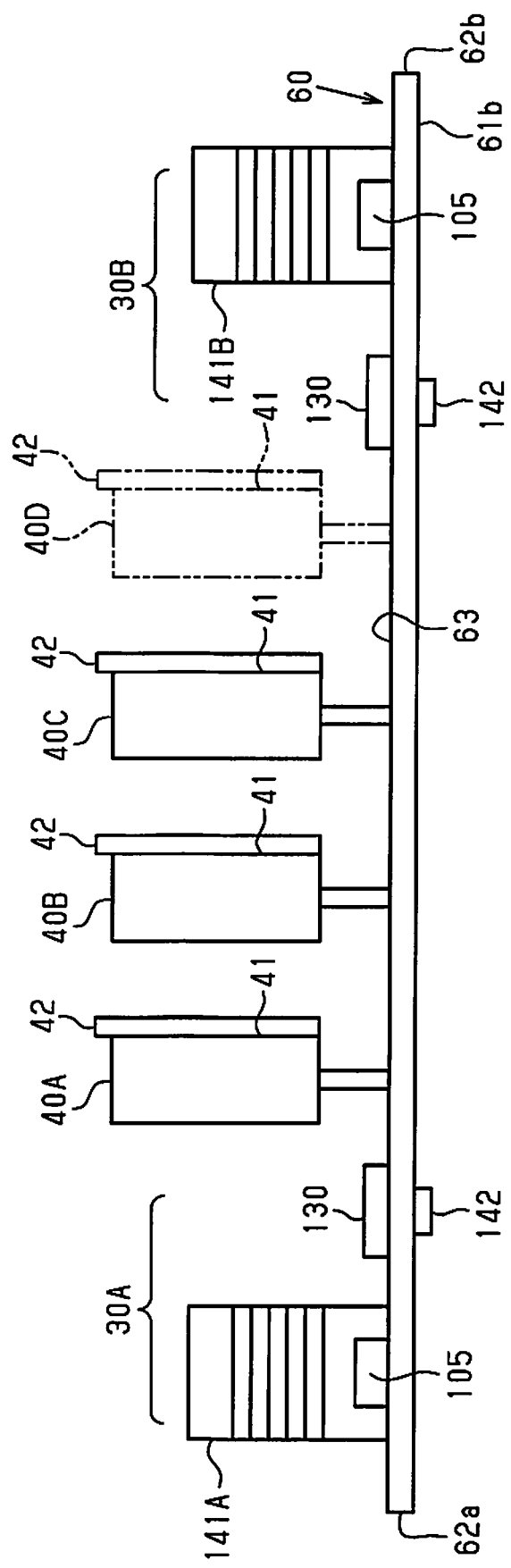
FIG. 8 is a side view of the circuit board on which the drive circuit of the character printing section is mounted.

As shown in FIGS. 7 and 8, each of the switching elements 40A, 40B, and 40C constitutes a substantially rectangular parallelepiped shape, and has main surface 41, which has the broadest surface area among a plurality (six in this case) of outer surfaces that the switching elements 40A, 40B, and 40C include. Further, each of the switching elements 40A, 40B, and 40C is mounted on the circuit board 60 in a posture in which the respective main surface 41 thereof intersects a line (an arbitrary line) that links the first smoothing coil 141A and the second smoothing coil 141B in a normal line direction of the board surface 63 and intersects the board surface 63 of the circuit board 60. In addition, in each of the switching elements 40A, 40B, and 40C, a metal plate 42, which has higher magnetic permeability than atmospheric air (air), is respectively attached to the main surface 41 by bonding, or the like.

In addition, the input terminal 65 is mounted on the circuit board 60 disposed on the one edge 61a side in the other set, namely, the edge 61a and edge 61b pair, which is different from the one set to which the edge 62a at which the first smoothing coil 141A is disposed and the edge 62b at which the second smoothing coil 141B is disposed belong. Further, in the present embodiment, the first smoothing coil 141A and the second smoothing coil 141B are respectively mounted disposed on the other edge 61b side, which is the opposite side to the input terminal 65. That is, in the present embodiment, the first smoothing coil 141A is mounted on the board surface 63 on a component surface side of the circuit board 60 disposed in a corner section formed by the edge 61b and the edge 62a, and the second smoothing coil 141B is mounted on the board surface 63 on the component surface side of the circuit board 60 disposed in a corner section formed by the edge 61*b* and the edge 62*b*.

In addition, from the control element 50, which is mounted on the circuit board 60, a distance LA that follows the board surface 63 up to the first smoothing coil 141A and a distance LB that follows the board surface 63 up to the second smoothing coil 141B are both longer than respective distances LC that follow the board surface 63 from the control element 50 up to each of the switching elements 40A, 40B, and 40C.

As shown by the dashed-two dotted lines in FIGS. 7 and 8, in the present embodiment, it is also possible for an additional switching element 40D to be mounted on the circuit board 60 between the switching element 40C and the second smoothing coil 141B. In this case, as a result of six switches 201 of the switching element 40D being added, it is possible to perform character printing by using a total of 24 head pins 207. In addition, the respective elements are mounted on the circuit board 60 with the FETs 130, the diodes 105, and the like, disposed on the board surface 63 in the vicinity of the first smoothing coil 141A and the second smoothing coil 141B, and the capacitors 142, and the like, which configure the smoothing circuits 34, disposed on a patterned surface side that is opposite the board surface 63. Additionally, in the present embodiment, a chip type is adopted in the capacitors 142. Naturally, an axial type may also be adopted in the capacitors 142.

Next, actions of the present embodiment, that is, actions of the circuit board 60 on which each electrical element that configures the drive circuit of the character printing section 20 and is shown in FIGS. 4 and 6 is mounted, will be described.

Firstly, as shown in FIG. 4, the reverse voltages generated in nine coils 200, which is half of the 18 that are used during character printing, are respectively supplied to the first reverse voltage regeneration circuit 30A and the second reverse voltage regeneration circuit 30B in an equally divided (two equal parts) manner. Accordingly, since a plurality of reverse voltages are superimposed and the voltage values of the voltages Veco are suppressed from becoming large, a circumstance in which the shapes of the electrical elements that configure the reverse voltage regeneration circuits are large is suppressed.

For example, as a result of an increase in the sizes of the first smoothing coil 141A and the second smoothing coil 141B, which correspond to the coils 141 of the smoothing circuits 34, being suppressed, variations in the regeneration voltage due to mutual interference (magnetic interference) of magnetic fluxes that the first smoothing coil 141A and the second smoothing coil 141B generate are suppressed. Alternatively, as a result of an increase in size of the capacitors 142 of the smoothing circuits 34 being suppressed, a circumstance in which the occupied surface area of wiring patterns of the smoothing circuits 34 that are formed on the circuit board 60 are large is suppressed.

In addition, as shown in FIGS. 7 and 8, since the first smoothing coil 141A and the second smoothing coil 141B are disposed on the circuit board 60 on respective sides of an edge pair that face one another, the first smoothing coil 141A and the second smoothing coil 141B are separated, and interference (magnetic interference) between the coils is suppressed.

In addition, since each of the switching elements 40A, 40B, and 40C is interposed between the first smoothing coil 141A and the second smoothing coil 141B, interference (magnetic interference) between the coils is suppressed by (the main surface 41 of) each of the switching elements 40A, 40B, and 40C. Furthermore, since a large number of magnetic fluxes flow through the metal plates 42, which are attached to the main surfaces 41, for example, among the magnetic fluxes that the first smoothing coil 141A generates, the number of magnetic fluxes that reach the second smoothing coil 141B is suppressed.

In addition, since, on the circuit board 60, the distances from the control element 50 up to the first smoothing coil 141A and the second smoothing coil 141B are longer than the distance from the control element 50 up to each of the switching elements 40A, 40B, and 40C, effects of the magnetic fluxes on the switching signals Sw or the character printing control signal Sc are suppressed.

According to the printer 11 of the abovementioned embodiment, it is possible to obtain the following effects.

(1) An increase in size of the electrical elements that configure the reverse voltage regeneration circuits is suppressed as a result of the two (plurality of) reverse voltage regeneration circuits, namely, the first reverse voltage regeneration circuit 30A and the second reverse voltage regeneration circuit 30B. In addition, interference (magnetic interference) between the two coils is suppressed as a result of the two smoothing coils, namely, the first smoothing coil 141A and the second smoothing coil 141B, being disposed with each of the switching elements 40A, 40B, and 40C interposed therebetween, and therefore, variations in the regenerated voltage are suppressed.

(2) It is possible to effectively suppress interference (magnetic interference) between the coils on the board surface 63 of the circuit board 60 by using the switching elements 40A, 40B, and 40C, which are disposed so that the main surfaces 41 act as walls of the two smoothing coils, namely, the first smoothing coil 141A and the second smoothing coil 141B.

(3) Since magnetic fluxes that the first smoothing coil 141A and the second smoothing coil 141B generate flow through the metal plates 42, which have high magnetic permeability, it is possible to suppress interference (magnetic interference) between the two coils.

(4) Since the two smoothing coils, namely, the first smoothing coil 141A and the second smoothing coil 141B, are disposed on the circuit board 60 in positions that are respectively separated from one another, it is possible to suppress interference (magnetic interference) between the coils.

(5) Since the two smoothing coils, namely, the first smoothing coil 141A and the second smoothing coil 141B, are disposed on the circuit board 60 in positions that are separated from the input terminal 65 to which the character printing control signal Sc is input, it is possible to suppress interference (magnetic interference) of the coil with the character printing control signal Sc.

(6) On the board surface of the circuit board, regarding the control element 50, since the distances up to the switching elements 40A, 40B, and 40C are shorter than the distance up to the first smoothing coil 141A and the second smoothing coil 141B, it is possible to suppress interference (magnetic interference) of the coils on the switching signals Sw that flow through the switching elements 40A, 40B, and 40C from the control element 50.

(7) In a printer 11 provided with multiple coils 200, since the number of reverse voltages of the coils 200 supplied to a single reverse voltage regeneration circuit is suppressed by the two (plurality) reverse voltage regeneration circuits, namely, the first reverse voltage regeneration circuit 30A and the second reverse voltage regeneration circuit 30B, it is possible to suppress an increase in size of the reverse voltage regeneration circuits.

Additionally, the abovementioned embodiment may be altered in the following manner.

The printer 11 of the above-mentioned embodiment may have a configuration in which fewer than 18 coils 200 (drive coils 25) are provided. For example, a printer 11 having a configuration in which character printing is performed as a result of a single head pin 207 striking the ink ribbon 208 against the medium P may also be used. Further, in such a printer 11, both of the two (plurality of) reverse voltage regeneration circuits, namely, the first reverse voltage regeneration circuit 30A and the second reverse voltage regeneration circuit 30B, may be connected to and configured to perform regeneration of the voltage in the single coil 200.

Figure 9:
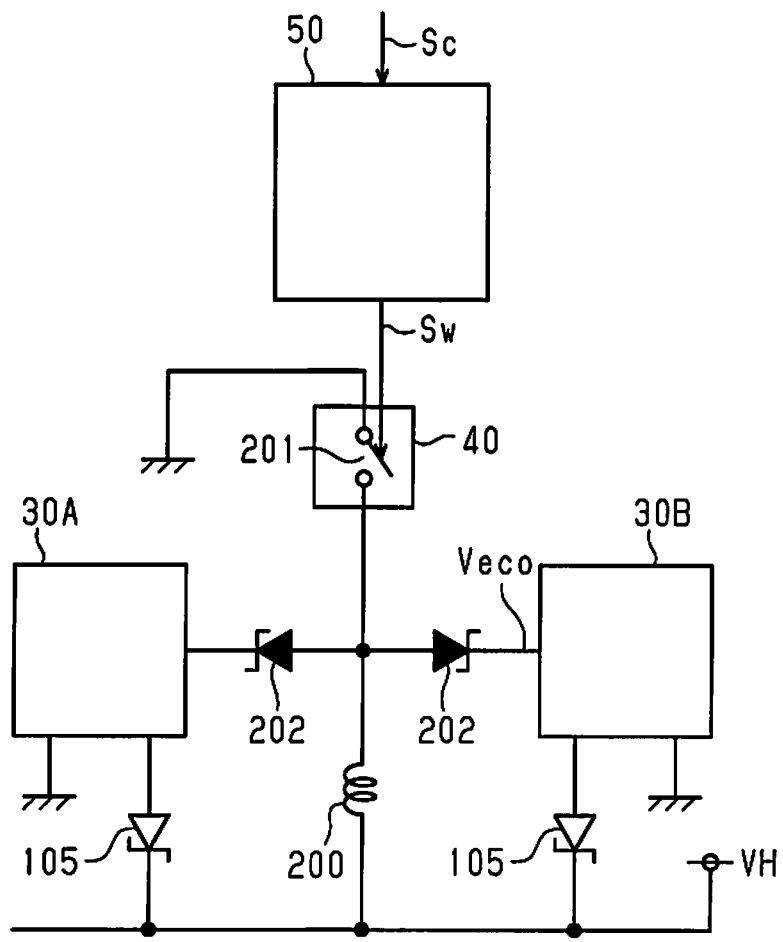
FIG. 9 is a block diagram that shows a configuration that regenerates a reverse voltage, which a single character printing section driving element generates, by using two reverse voltage regeneration circuits.

As shown in FIG. 9, in the present modification example, both of the two (plurality) reverse voltage regeneration circuits, namely, the first reverse voltage regeneration circuit 30A and the second reverse voltage regeneration circuit 30B, are connected to the single coil 200, one end of which is connected to the power source VH, at the other end, which is connected to the switch 201 of the switching element 40, via respective diodes 202.

For example, in a case in which the coil 200 has a large reactance, the voltage value of the reverse voltage generated in the coil 200 is large. Therefore, a large current (a large charge) is supplied (applied) to the reverse voltage regeneration circuits via the diodes 202 in accordance with the large generated voltage value. In such a case, according to the circuit configuration shown in FIG. 9, it is possible to distribute the large supplied charge and cause the charge to flow into both of the first reverse voltage regeneration circuit 30A and the second reverse voltage regeneration circuit 30B. As a result of this, it is possible to suppress a rise in the voltage endurance required in the electrical elements (for example, the capacitors 142) that configure the first reverse voltage regeneration circuit 30A and the second reverse voltage regeneration circuit 30B.

Additionally, in the circuit configuration of the present modification example that is shown in FIG. 9, the printer 11 may be provided with a plurality of (for example, 18 in a similar manner to the above-mentioned embodiment) coils 200 (drive coils 25). In this case, both of the first reverse voltage regeneration circuit 30A and the second reverse voltage regeneration circuit 30B are respectively connected the provided coils 200.

In the above-mentioned embodiment, a first driving element group and a second driving element group, which are each composed of a number of the coils 200 (the drive coils 25) that is less than half of the number that drive the character printing sections 20 during character printing, may be provided. In this case, the first reverse voltage regeneration circuit 30A regenerates reverse voltages that the coils 200 included in the first driving element group create, and the second reverse voltage regeneration circuit 30B regenerates reverse voltages that the coils 200 included in the second driving element group create.

For example, in the circuit configuration shown in FIG. 4, the six coils 200 that are connected to the power source VH by the six switches 201 of the switching element 40A may be connected to the first reverse voltage regeneration circuit 30A as the first driving element group. In addition, the six coils 200 that are connected to the power source VH by the six switches 201 of the switching element 40C may be connected to the second reverse voltage regeneration circuit 30B as the second driving element group.

Additionally, in this case, the six coils 200 that are connected to the power source VH by the six switches 201 of the switching element 40B may be connected to a reverse voltage regeneration circuit provided separately from the two reverse voltage regeneration circuits of the first reverse voltage regeneration circuit 30A and the second reverse voltage regeneration circuit 30B. That is, a configuration in which three driving element groups, which are each composed of a number (six, which corresponds to three equal parts in this instance) of the coils 200 (the drive coils 25) that is less than half of the number that drive the character printing sections 20 during character printing, are provided, and three reverse voltage regeneration circuits that are connected to the coils 200 of each of the driving element group are provided may also be used.

Naturally, in a case of such a configuration, the three coils 141 that respectively configure the smoothing circuits 34 of the three reverse voltage regeneration circuits are mounted on the board surface 63 of the circuit board 60 in a state in which at least one of the three switching elements 40A, 40B, and 40C is disposed between two adjacent coils 141.

Alternatively, the six coils 200 that are connected to the power source VH by the six switches 201 of the switching element 40B may be connected to both the first reverse voltage regeneration circuit 30A and the second reverse voltage regeneration circuit 30B in the manner of the above-mentioned modification example shown in FIG. 9.

In the above-mentioned embodiment, on the circuit board 60, the distance LA that follows the board surface 63 from the control element 50 up to the first smoothing coil 141A and the distance LB that follows the board surface 63 from the control element 50 up to the second smoothing coil 141B need not necessarily be longer than the respective distances LC that follow the board surface 63 from the control element 50 up to each of the switching elements 40A, 40B, and 40C. For example, in a case in which there is only a slight effect of magnetic fluxes on the switching signals Sw that flow through the switching elements 40A, 40B, and 40C from the control element 50, the distance LC may be longer than the distance LA or the distance LB.

In the above-mentioned embodiment, the input terminal 65, and the first smoothing coil 141A and the second smoothing coil 141B need not necessarily be mounted on the circuit board 60 with the input terminal 65 disposed on the one edge 61a side and the first smoothing coil 141A and the second smoothing coil 141B disposed on the other edge 61b side. For example, in a case in which there is only a slight effect of magnetic fluxes on the character printing control signal Sc, the input terminal 65 may be mounted on the circuit board 60 shown in FIG. 7 disposed on the edge 62a side or the edge 62b side. Alternatively, the input terminal 65 may be mounted disposed on the edge 61b side on which the first smoothing coil 141A and the second smoothing coil 141B are disposed.

In the above-mentioned embodiment, the first smoothing coil 141A and the second smoothing coil 141B need not necessarily be respectively mounted on the circuit board 60 with the first smoothing coil 141A disposed on the one edge 62a side and the second smoothing coil 141B disposed on the other edge 62b side. For example, the first smoothing coil 141A may be disposed on the one edge 61a side and the second smoothing coil 141B may be disposed on the other edge 61b side. Alternatively, the first smoothing coil 141A and the second smoothing coil 141B need not necessarily be disposed on the circuit board 60 divided between the respective edge sides of the one set among the two sets of edge pairs. That is, as long as at least one of the switching elements 40A, 40B, and 40C is disposed therebetween, the first smoothing coil 141A and the second smoothing coil 141B may be disposed in an arbitrary position on the board surface 63 of the circuit board 60.

In the above-mentioned embodiment, in the switching elements 40A, 40B, and 40C (the switches), the metal plates 42, which have higher magnetic permeability than atmospheric air (air) need not necessarily be attached to the main surfaces 41. For example, in a case in which the switching elements 40A, 40B, and 40C themselves have a magnetically permeable property, such as including a material having a magnetically permeable property in an inner portion thereof, the metal plates 42, which have high magnetic permeability are not necessary.

In the above-mentioned embodiment, the switching elements 40A, 40B, and 40C (the switches) need not necessarily be mounted on the circuit board 60 in a posture in which the main surfaces 41 intersect the board surface 63 of the circuit board 60. For example, mounting on the circuit board 60 may be performed in a posture in which the main surfaces 41 follow the board surface 63. In short, the switching elements 40A, 40B, and 40C (the switches) must be mounted on the circuit board 60 in a posture in which it is possible to suppress magnetic flux interference between the two coils 141 (the first smoothing coil 141A and the second smoothing coil 141B).

In the above-mentioned embodiment, as long as the shapes of the switching elements 40A, 40B, and 40C (the switches) have a plurality of outer surfaces, the shapes need not necessarily be substantially rectangular parallelepiped shapes, and for example, the surface area of each outer surface may be equivalent, and therefore, the main surfaces 41 need not necessarily be provided. In this case, as long as the posture is capable of suppressing magnetic flux interference between the two coils 141 (the first smoothing coil 141A and the second smoothing coil 141B), the switching elements 40A, 40B, and 40C (the switches) may be mounted on the circuit board 60 in an arbitrary posture.

In the printer 11 of the above-mentioned embodiment, a piezoelectric element may be used as the character printing section driving element that electromechanically converts drive power and drives the character printing sections. That is, the piezoelectric element is an electromechanical conversion element that expands and contracts in accordance with an applied voltage and may be configured so as to drive (rotate) the character printing sections 20 (the levers 204) using the expansion and contraction.

For example, the printer 11 of the above-mentioned embodiment may be a large format printer in which the medium P is a longitudinal sheet of paper and printing is performed on the longitudinal sheet of paper. In this case, the printer 11 may be configured so that the sheet of paper is unwound from a state of being wound in a rolled form and transported wound and hanging from the roller 16.

In the printer 11 of the above-mentioned embodiment, the medium P can adopt various media such as a plant-based paper, a resin film, a metal foil, a metal film, a composite film of a resin and a metal (a laminated film), a woven fabric, a non-woven fabric, or a ceramic sheet.

The printer 11 of the above-mentioned embodiment, may be an ink jet type liquid ejecting apparatus that ejects a liquid from a liquid ejecting head, which is an example of a character printing section 20, and character prints on a medium by causing a metal plate to bend using the expansion and contraction of a piezoelectric element. Additionally, states that leave a granular, tear form, or filament form trail are included as states of a liquid that is discharged as minute liquid droplets from a liquid ejecting apparatus. In addition, the liquid that is referred to in this instance may be any material that can be ejected from a liquid ejecting apparatus. For example, the material may be any material in a state in which the matter is in a liquid phase, and includes liquid state materials with high and low viscosities, and fluid state materials such as sols, gel waters, other inorganic solvents, organic solvents, liquid solutions, liquid resins, and liquid metals (metallic melts). Furthermore, in addition to liquids in which a substance is in a single state, the material also includes liquids in which particles of a functional material composed of solid matter such as a pigment or a metal particle is dissolved, dispersed, or mixed into a solvent. Ink, liquid crystal, and the like can be included as representative examples of the liquid. In this instance, the term ink includes various liquid compositions such as an ordinary water-based ink or oil-based ink, a gel ink, or a hot melt ink.

What is claimed is:

1. A printer that performs character printing by driving a character printing section, the printer comprising:
    a character printing section driving element that electromechanically converts drive power and drives the character printing section;
    a switch that switches between states of whether or not to supply the drive power to the character printing section driving element;
    a reverse voltage regeneration circuit that regenerates a reverse voltage generated by electromechanical conversion in the character printing section driving element after supply, to the character printing section driving element, of the drive power is interrupted; and
    a circuit board on which the reverse voltage regeneration circuit and the switch are mounted,
    wherein the reverse voltage regeneration circuit has a first reverse voltage regeneration circuit and a second reverse voltage regeneration circuit,
    the first reverse voltage regeneration circuit has a first smoothing coil that smoothes the reverse voltage of the character printing section driving element, and the second reverse voltage regeneration circuit has a second smoothing coil that smoothes the reverse voltage of the character printing section driving element, and
    the switch is mounted on a board surface of the circuit board so as to be disposed between the first smoothing coil and the second smoothing coil.

2. The printer according to claim 1,
    wherein the switch
        forms a shape that has a plurality of outer surfaces, and
        is mounted on the circuit board in a posture in which, a main surface, which has the broadest surface area among the plurality of outer surfaces, intersects the board surface of the circuit board.

3. The printer according to claim 2,
    wherein, in the switch, a metal plate, which has higher magnetic permeability than atmospheric air, is attached to the main surface.

4. The printer according to claim 3,
    wherein the circuit board constitutes a rectangular form having two sets of edge pairs that face one another, and
    the first smoothing coil and the second smoothing coil are respectively mounted on the circuit board in one set among the two sets of edge pairs with the first smoothing coil disposed on one edge side and the second smoothing coil disposed on other edge side.

5. The printer according to claim 4,
    wherein an input terminal, to which a character printing control signal for generating a switching signal for switching the switch is input, and the first smoothing coil and the second smoothing coil are respectively mounted on the circuit board with the input terminal disposed on one edge side and the first smoothing coil and the second smoothing coil disposed on other edge side, in other set of an edge pair, which is different from the one set to which the edges at which the first smoothing coil and the second smoothing coil are disposed belong.

6. The printer according to claim 5,
wherein a control element, which generates the switching signal using the character printing control signal input from the input terminal and supplies the switching signal to the switch, is mounted on the circuit board, and
on the board surface of the circuit board, a distance that follows the board surface from the control element up to the first smoothing coil and a distance that follows the board surface from the control element up to the second smoothing coil are both longer than a distance that follows the board surface from the control element up to the switch.

7. The printer according to claim 1, further comprising
a first driving element group and a second driving element group, which each include half or less of a number of character printing section driving elements that drive the character printing section during character printing,
wherein the first reverse voltage regeneration circuit regenerates reverse voltages generated by character printing section driving elements included in the first driving element group, and
the second reverse voltage regeneration circuit regenerates reverse voltages generated by character printing section driving elements included in the second driving element group.

* * * * *